United States Patent
Huang et al.

[11] Patent Number: 6,080,664
[45] Date of Patent: Jun. 27, 2000

[54] METHOD FOR FABRICATING A HIGH ASPECT RATIO STACKED CONTACT HOLE

[75] Inventors: Sen-Huan Huang, Tainan; Wan-Yih Lien, Hsinchu; Yeur-Luen Tu, Taipei, all of Taiwan

[73] Assignee: Vanguard International Semiconductor Corporation, Hsin-Chu, Taiwan

[21] Appl. No.: 09/086,771

[22] Filed: May 29, 1998

[51] Int. Cl.[7] ................................................. H01L 21/00
[52] U.S. Cl. .................. 438/638; 438/624; 438/632; 438/657; 438/745; 257/760; 257/774
[58] Field of Search .................... 438/638, 624, 438/745, 427, 657, 675, 640, 632, 672, 685, 688; 257/760, 774

[56] References Cited

U.S. PATENT DOCUMENTS

| | | | |
|---|---|---|---|
| 5,200,808 | 4/1993 | Koyama et al. | 250/450 |
| 5,284,800 | 2/1994 | Lien et al. | 437/195 |
| 5,554,565 | 9/1996 | Liaw et al. | 437/192 |
| 5,619,071 | 4/1997 | Myers et al. | 257/753 |
| 5,648,298 | 7/1997 | Cho | 437/187 |
| 5,841,196 | 11/1998 | Gupta et al. | 257/774 |
| 5,936,308 | 8/1999 | Rolfson | 257/774 |

*Primary Examiner*—John F. Niebling
*Assistant Examiner*—Ha Tran Nguyen
*Attorney, Agent, or Firm*—George O. Saile; Stephen B. Ackerman

[57] ABSTRACT

A method for creating a metal filled, high aspect ratio, contact opening, in thick insulator layers, allowing contact between a metal interconnect structure and a region of a semiconductor substrate, has been developed. The process features creating a stacked contact hole opening, comprised of a upper contact hole opening, of a specific diameter size, overlying a lower contact hole opening, having an opening larger in diameter than the opening used for the upper contact hole opening. The lower contact hole opening is created via an anisotropic RIE procedure, followed by a wet etch procedure, used to enlarge the diameter of the lower contact hole opening. The upper contact hole opening, created using an anisotropic RIE procedure, is formed using the original diameter opening, used previously for the pre-wet etched, lower contact hole opening, and is easily aligned to a metal filled, enlarged lower contact hole opening.

19 Claims, 5 Drawing Sheets

METHOD FOR FABRICATING A HIGH ASPECT RATIO STACKED CONTACT HOLE

BACKGROUND OF THE INVENTION (1) Field of the Invention

The present invention relates to methods used to fabricate semiconductor devices, and more specifically to a process used to create contact holes, through multi-layered insulators, to an underlying semiconductor surface.

(2) Description of Prior Art

The semiconductor industry is continually striving to reduce the cost of semiconductor devices, while still attempting to improve the performance of these same semiconductor devices. These objectives are being successfully addressed via micro-miniaturization, or the ability to fabricate semiconductor devices with sub-micron features. Performance improvements are realized via reductions in performance degrading parasitic capacitance, obtained using sub-micron device features. In addition smaller chips, still offering device densities obtained with larger counterparts, allow more chips to be gained from a starting semiconductor substrate, thus reducing the processing cost for a specific semiconductor chip.

The use of sub-micron features also demand the use of contact holes with diameters as small 0.35 uM or less. In addition specific devices, such as dynamic random access memory, (DRAM), devices, are designed to use contact holes, opened to expose the surface-of the semiconductor substrate, with these contact holes opened in, thick, multi-layered, insulator materials. For example a first insulator layer may be used to passivate a storage node contact plug, while a second insulator, third and fourth insulator layer, may be used for insulating the stacked capacitor structure, used in DRAM devices. The cumulative thickness of these insulator layers, in combination with the sub-micron diameter used for contact holes to the semiconductor substrate, result in contact holes with high aspect ratios, and present difficulties when attempting to metal fill.

A stacked contact procedure features a first, or lower contact hole opening, in underlying insulator layers, with metal filling, performed at a specific stage of the DRAM procedure. After deposition of the overlying insulator layers, a second, or upper contact hole is opened, exposing the underlying, metal filled, lower contact hole. The stacked contact procedure is concluded by metal filling the upper contact hole. Since the stacked contact procedure is comprised of two contact openings and two metal fills, the aspect ratio for either contact opening is reduced, when compared to one step contact hole openings. However difficulties can arise using the stacked contact procedure, when attempting to align the upper contact hole opening, to the underlying metal filled, lower contact hole. Misalignment can result in metal plugs that are thin, or discontinuous, at the point where the contact holes meet, resulting in reliability risks, in the form of electromigration.

This invention will describe a process for fabricating a stacked contact hole opening, in which the chance of misalignment between the upper and lower contact hole openings is reduced. This invention subjects the dry etched, lower contact hole opening, to a wet etch procedure, prior to metal fill, resulting in a larger diameter opening. The placement, or alignment, of the upper contact hole opening, to the larger diameter, metal filled lower contact hole, using the identical photolithographic mask previously used for the lower contact hole opening, will now be easier to achieve. Prior art, such as Cho, in U.S. Pat. No. 5,648,298, and Koyama et al, in U.S. Pat. No. 5,200,808, describe methods for forming contacts hole openings, but not the use of the stacked contact opening, using dry etched - wet etched lower contact openings, directly underlying am upper contact hole opening.

SUMMARY OF THE INVENTION

It is an object of this invention to form a high aspect ratio, (the ratio of the depth of the contact hole to the diameter opening of the contact hole), contact hole, in a multi-layered insulator films, to an underlying region of a semiconductor substrate.

It is another object of this invention to use a stacked contact concept, comprising a metal filled, lower contact hole, in a group of lower insulator layers, contacting the underlying region of a semiconductor substrate, and an upper contact hole, in a upper insulator layer, overlying, and exposing the metal filled, lower contact hole.

It is still another object of this invention to use an upper insulator layer, exhibiting a lower removal rate in a specific wet etch solution, than the removal rate of the lower insulator layers, in the same wet etch solution.

It is still yet another object of this invention to use a dry etching procedure to create the lower contact hole, with a first diameter opening, followed by exposure to a wet etching procedure, resulting in an enlargement of the lower contact hole opening.

It is still yet another object of this invention to form the upper contact hole, via a dry etching procedure, and using the same photolithographic mask that was used to create the lower contact hole, resulting in a narrow, upper contact hole, overlying the wider, metal filled, lower contact hole.

In accordance with the present invention, a process is described for forming a stacked contact hole opening, in a peripheral region of a semiconductor chip, and when metal filled, used as a conductive contact to an underlying region of the semiconductor substrate. The invention features the use of a lower contact hole opening, enlarged via exposure to a wet etch solution, and an narrow, upper contact hole opening, overlying and contacting the metal filled, lower contact hole opening. A first insulator layer, used to passivate transfer gate transistors, and storage node contact plugs, of a cell array region of the semiconductor chip, is provided, followed by a second insulator layer, used to accommodate additional overlying polysilicon plug structures. After creation of a capacitor structure, in the cell array region, a third insulator layer of boro-phosphosilicate, (BPSG), is deposited and reflowed. A first photolithographic, and anisotropic, dry etch procedures, is used to create a lower contact hole opening, with a first diameter opening, in the group of lower insulator layers, comprised of the BPSG layer, the second insulator layer, and the first insulator layer, exposing an underlying region of the semiconductor substrate, in the peripheral region. An exposure to a dilute hydrofluoric, (DHF), acid solution, results in the enlargement of the first diameter opening, creating a second diameter opening, for the lower contact hole opening. A collimated titanium, and titanium nitride deposition, is followed by a chemically vapor deposited tungsten deposition, completely filling the lower contact hole opening. A blanket, RIE procedure is used to remove unwanted metal from the top surface of the BPSG layer. A fourth insulator layer, of silicon oxide, obtained using plasma enhanced chemical vapor deposition, (PECVD), procedures, is next deposited, followed by a chemical mechanical polishing, (CMP), procedure, used to planarize the top surface of the fourth insulator layer. A second photolithographic and anisotropic dry etch procedure, using the mask with the first diameter opening, is used to open the upper contact hole opening, overlying and contacting the wider, metal filled, lower contact hole opening. After a wet dip in DHF, another layer of collimated titanium and titanium nitride are deposited, followed by the deposition of an aluminum-copper layer. After formation of a aluminum-copper plug, in the upper contact hole opening, via removal of unwanted titanium, titanium nitride, and aluminum-copper, from the top surface of the fourth insulator layer, an aluminum-copper interconnect structure, is formed, contacting the underlying aluminum-copper plug, in the upper contact hole opening.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The process for fabricating a high aspect ratio, stacked contact hole, in a composite insulator layer, comprised of a lower contact hole opening, enlarged via a wet etch procedure, and an overlying, dry etched, upper contact hole, will now be described in detail. This invention will illustrate the stacked contact hole, in a peripheral region, of a semiconductor substrate, with an adjacent cell array of a dynamic random access memory, (DRAM), device, also on the semiconductor substrate. However this invention can be applied to peripheral, or to cell array regions, of other types of devices, such as static random access memory, (SRAM), devices.

Figure 1:
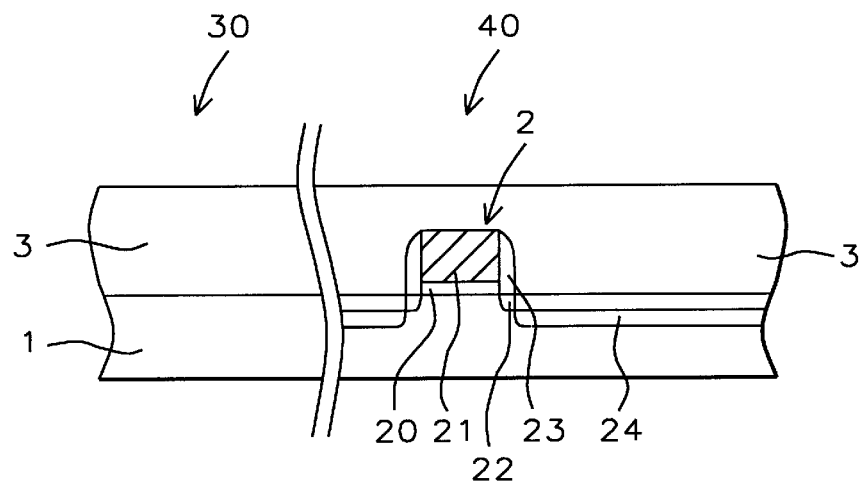
FIGS. 1–10, which schematically, in cross-sectional style, illustrate the key fabrication stages used to create a stacked contact hole opening.

FIG. 1, schematically shows a peripheral region 30, and a cell array region 40, of a DRAM device. A P type, semiconductor substrate 1, is used, with a transfer gate transistor 2, located in cell array region 40. Transfer gate transistor 2, is comprised of gate insulator layer 20, polysilicon, or polycide gate structure 21, N type, lightly doped region 22, insulator spacers 23, and N type, heavily doped source and drain region 23. A first insulator layer 3, comprised of a boro-phosphosilicate, (BPSG), layer is deposited using either PECVD or low pressure chemical vapor deposition, (LPCVD), procedures, to a thickness between about 8000 to 9000 Angstroms. First insulator layer 3, is planarized via CMP procedures, resulting in a smooth top surface topology.

Figure 2:
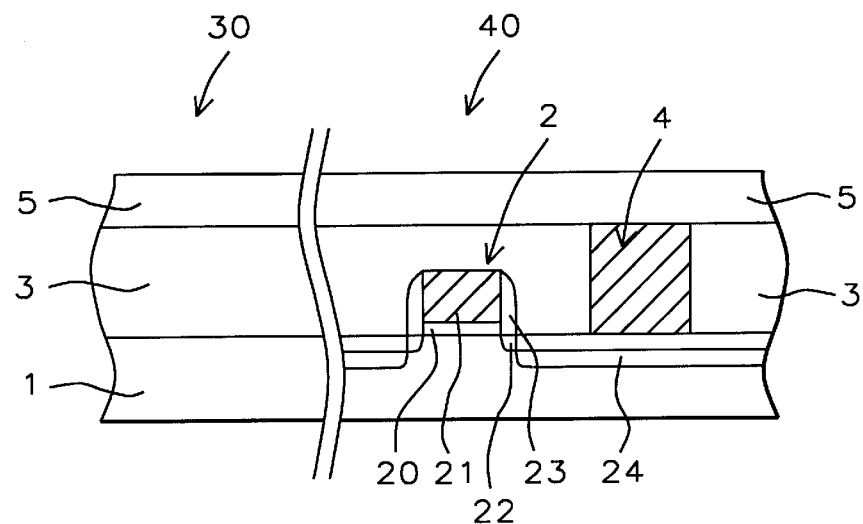

A storage node contact hole is next opened in first insulator layer 3, using conventional photolithographic and RIE procedures, exposing underlying source and drain region 24, in cell array region 40. After removal of the photoresist shape, used for definition of the storage node contact hole, a polysilicon contact plug structure 4, is formed. Polysilicon contact plug structure 4, schematically shown in FIG. 2, is formed via deposition and doping of a polysilicon layer, followed by removal of unwanted polysilicon, from the top surface of first insulator layer 3, via RIE or CMP procedures. A second insulator layer 5, again comprised of BPSG, is next deposited using LPCVD or PECVD procedures, to a thickness between about 4000 to 5000 Angstroms. The top surface of second insulator layer 5, is smooth as a result of deposition on the underlying smooth top surface of first insulator layer 3. This is schematically shown in FIG. 2.

Figure 3:
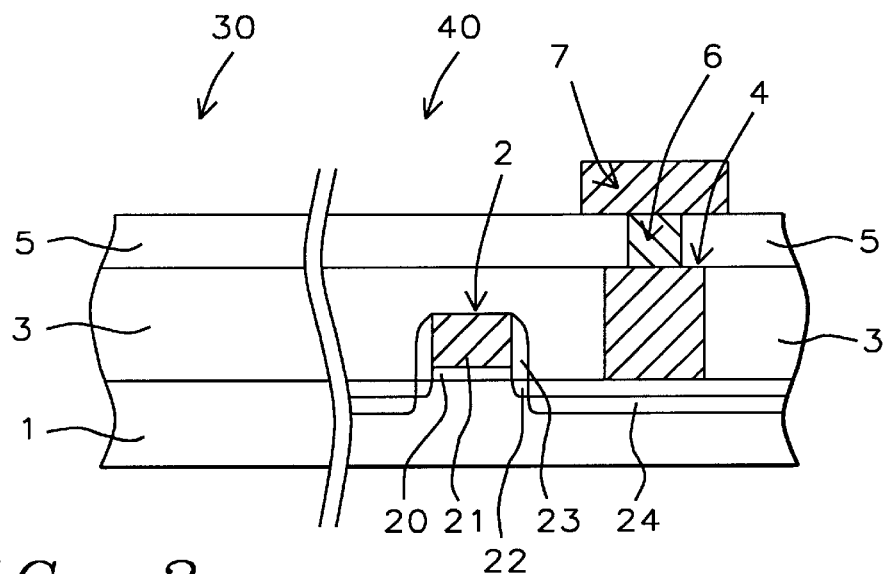

An opening in second insulator layer 5, is created via photolithographic and RIE procedures, and used to accommodate a polysilicon plug extension 6, in cell array region 40, schematically shown in FIG. 3. Polysilicon plug extension is created via a polysilicon deposition and doping procedure, followed by removal of unwanted polysilicon via RIE or CMP procedures. A stacked capacitor structure 7, is next formed, overlying, and contacting underlying polysilicon plug extension 6, shown schematically in FIG. 3. Stacked capacitor structure 7, is comprised of a bottom storage node electrode, and an upper cell electrode, with a capacitor dielectric layer, sandwiched between electrodes.

Figure 4:
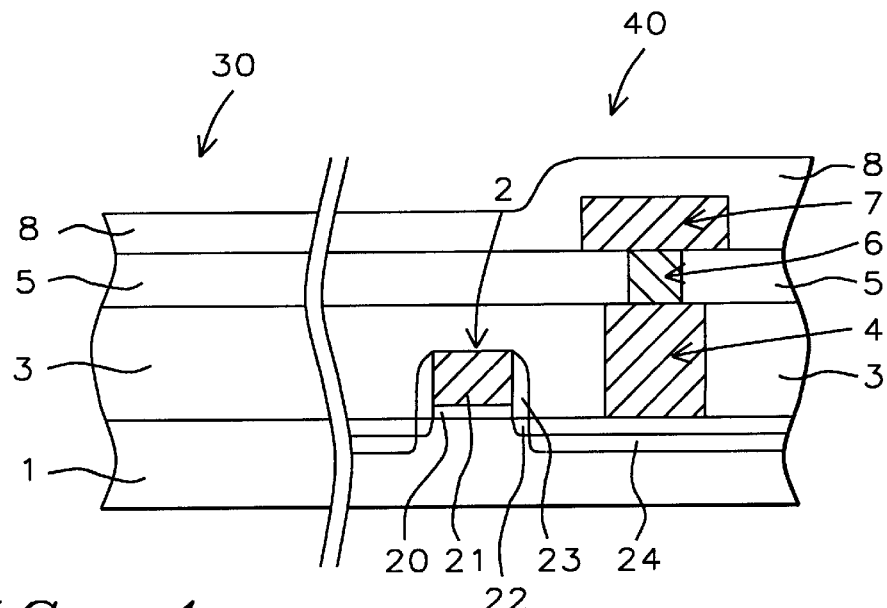

A third insulator layer 8, comprised of BPSG, is next deposited, using PECVD procedures, to a thickness between about 4000 to 5000 Angstroms. BPSG layer 8, is comprised of between about 4 to 5 weight % $B_2O_3$, and between about 3 to 4 weight % $P_2O_5$. These components will influence the reflow characteristics, as well as the wet etch rate, of BPSG layer 8. A reflow process is next performed at a temperature between about 850 to 900° C., for a time between about 25 to 35 min, in an nitrogen ambient, to flow BPSG layer 8, and to reduce the severity of the topology of BPSG layer 8, over stacked capacitor structure 7, in cell array region 40. This is schematically shown in FIG. 4.

Figure 5:
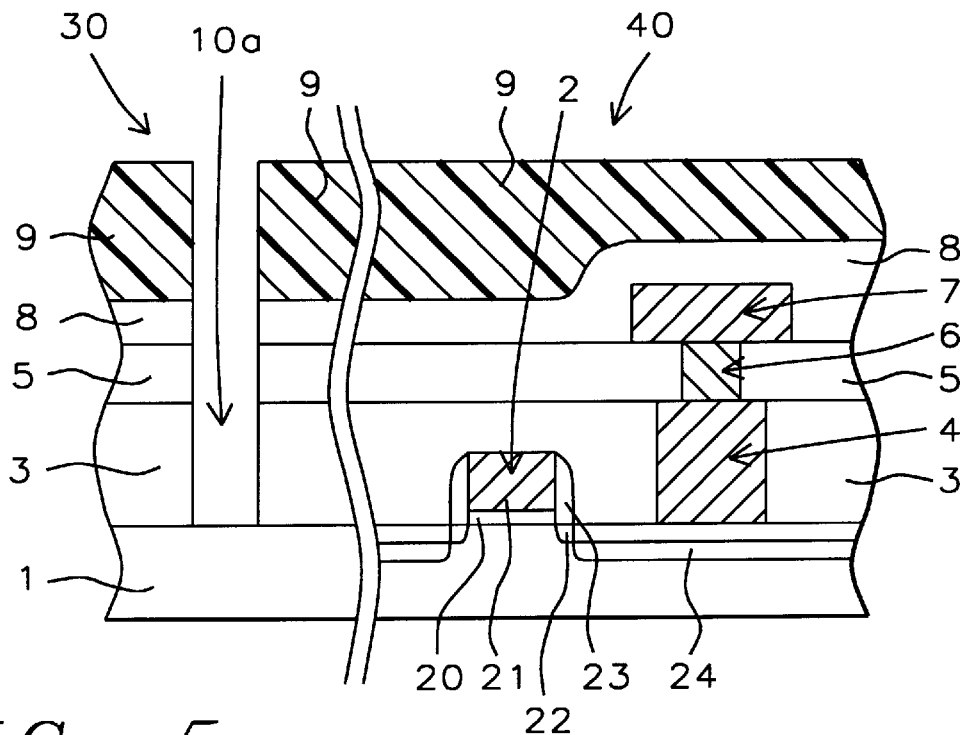
Figure 6:
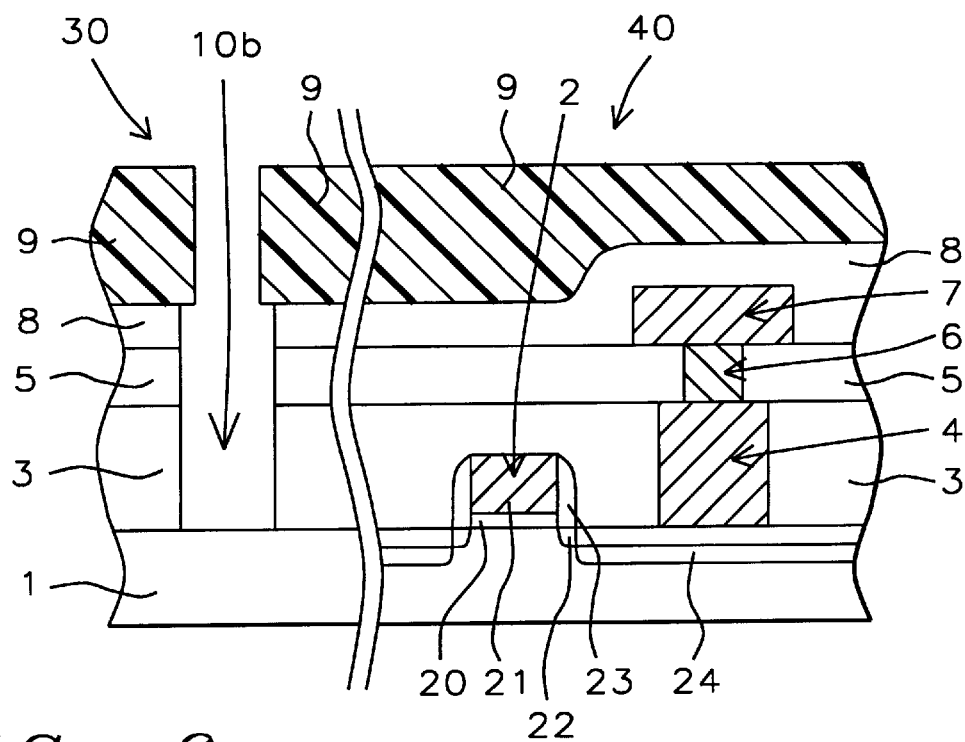

FIG. 5, schematically shows the creation of lower contact hole opening 10a, formed in the group of insulator layers comprised of BPSG layer 8, second insulator layer 5, and first insulator layer 3, exposing a region of semiconductor substrate 1, in peripheral region 30. This is accomplished using photoresist shape 9, as a mask, and creating lower contact hole opening 10a, via an anisotropic RIE procedure, using $CHF_3$ as an etchant. The diameter of lower contact hole opening 10a, is between about 0.30 to 0.35 uM. A critical wet etch procedure, performed in a DHF solution, is next used to enlarge the diameter of lower contact hole opening, creating lower contact hole opening 10b, with a diameter between about 0.40 to 0.45 uM. This is shown schematically in FIG. 6. The wet etch characteristics of BPSG layer 8, is influenced by the boron and phosphorous components, contained in BPSG layer 8.

Figure 7:
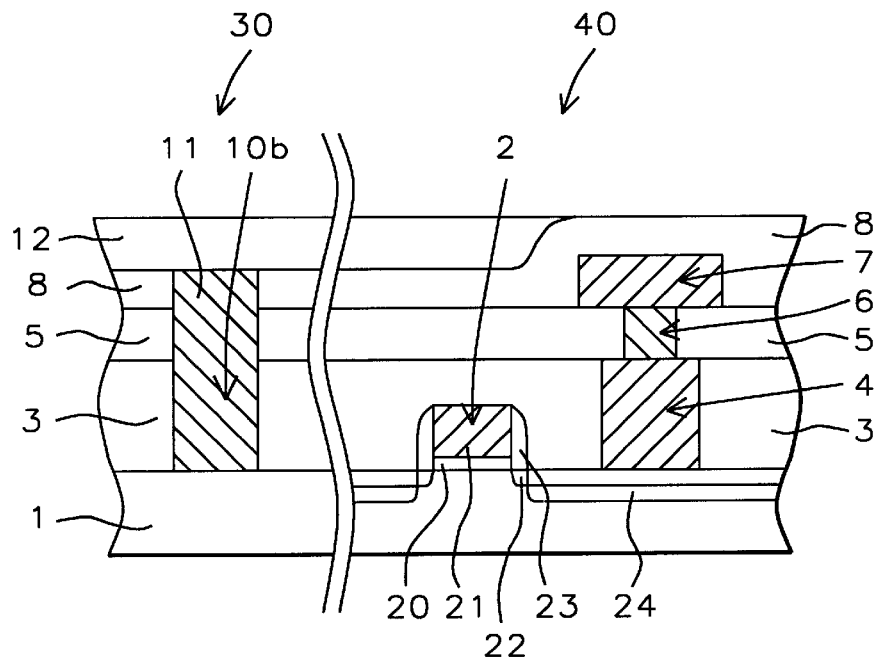

After removal of photoresist shape 9, via plasma oxygen ashing and careful wet cleans, tungsten plug 11, is formed in lower contact hole opening 10b. This is shown schematically in FIG. 7. First a collimated layer of titanium, and a collimated layer of titanium nitride, are deposited using R.F. sputtering procedures, to a cumulative thickness between about 1500 to 1800 Angstroms. This is followed by the deposition of a tungsten layer, via LPCVD procedures, at a thickness between about 7000 to 8000 Angstroms. Removal of the unwanted tungsten, titanium nitride, and titanium layers, from the top surface of BPSG layer 8, via a RIE procedure, result in tungsten plug 11, in lower contact hole opening 10b, in peripheral region 30. A fourth insulator layer 12, comprised of silicon oxide, and obtained via a PECVD procedure, at a thickness between about 6000 to 8000 Angstroms, is next deposited, followed by a planarizing procedure, using chemical mechanical polishing, resulting in a smooth and even, top surface of fourth insulator layer 12. This is schematically shown in FIG. 7.

Figure 8:
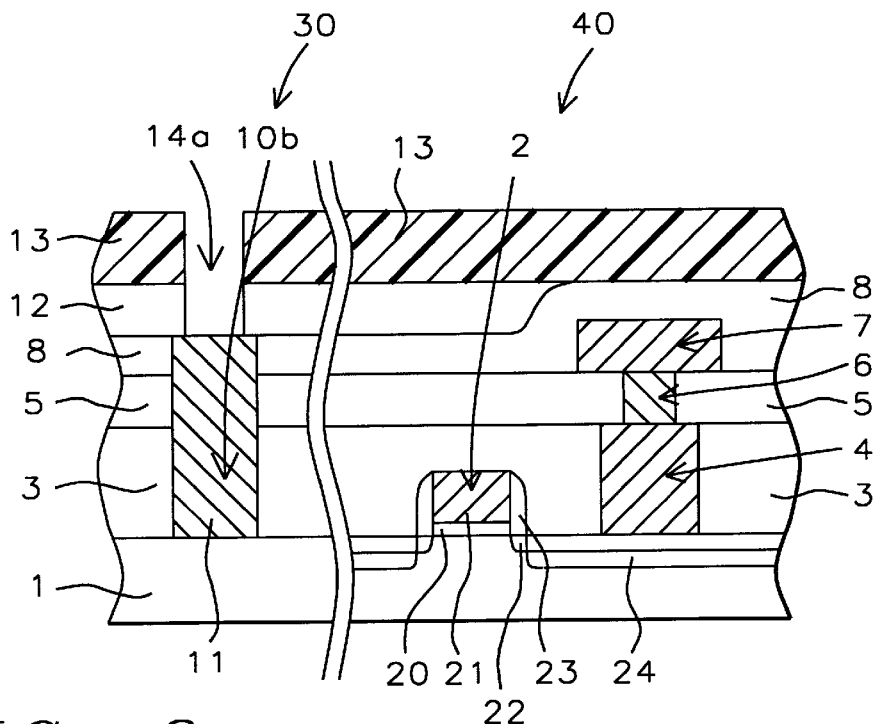

Another photoresist shape 13, using the same mask as was previously used to create lower contact hole opening 10a, is again used, along with an anisotropic RIE procedure, using $CHF_3$ as an etchant, to create upper contact hole opening 14a, in fourth insulator layer 12. Upper contact hole opening 14a, with a diameter opening, between about 0.30 to 0.35 uM, identical to the diameter of the pre-DHF etched, lower contact hole opening 10a, is easily aligned to the underlying, wider, metal filled, lower contact hole opening 10b. This is shown schematically, in FIG. 8, in peripheral region 30.

Figure 9:
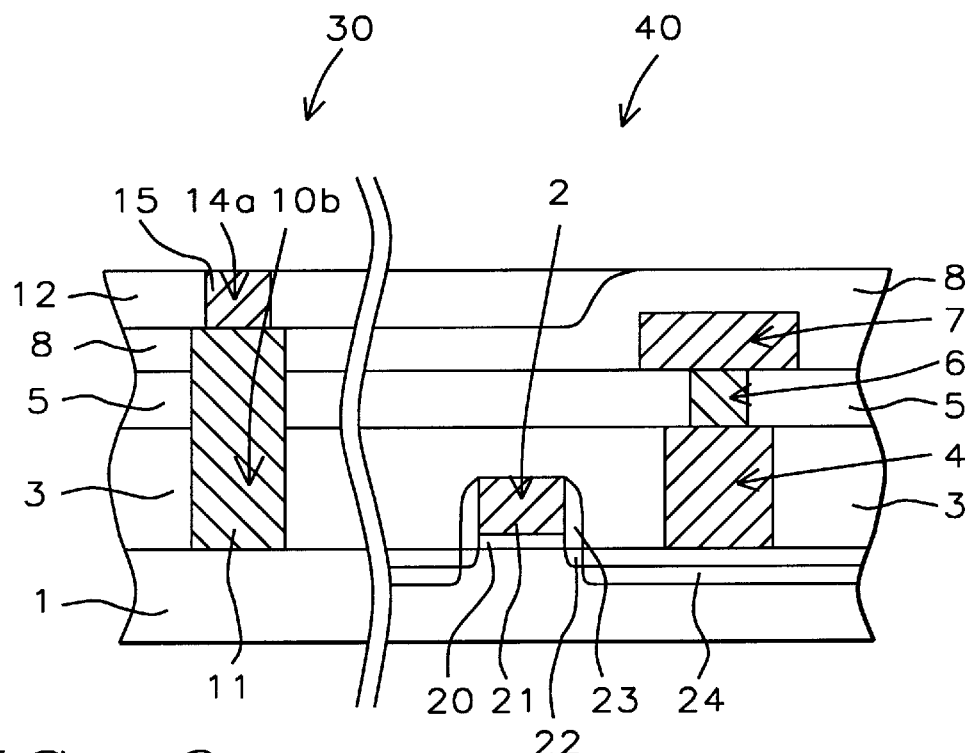

After removal of photoresist shape 13, via use of plasma oxygen ashing and careful wet cleans, a pre-metallization dip, in a DHF solution, is performed to prepare the top surface of tungsten plug 11, for another metal plug, used to fill upper contact hole opening 14a. The etch rate of fourth insulator layer 12, PECVD silicon oxide, is lower in the DHF solution than the removal rate of BPSG layer 8, therefore not enlarging the diameter of upper contact hole opening 14a, during the pre-metallization clean procedure. Layers of collimated titanium, and titanium nitride, are again deposited via R.F. sputtering procedures, to a cumulative thickness between about 1000 to 1200 Angstroms, followed by the deposition of a hot aluminum copper layer, using R.F. sputtering procedures, at a temperature between about 400 to 450° C., to a thickness between about 5000 to 6000 Angstroms, and completely filling upper contact hole opening 14a. Removal of unwanted aluminum-copper, titanium nitride, and titanium, from the top surface of fourth insulator layer 12, in peripheral region 30, and from the top surface of fourth insulator layer 12, and BPSG layer 8, in cell array region 40, is accomplished using a CMP procedure, or a selective RIE procedure, using $Cl_2$ as an etchant. The result of these procedures is an aluminum-copper plug 15, in upper contact hole opening 14a, overlying and contacting, underlying tungsten plug 11. This is shown schematically in FIG. 9.

Figure 10:
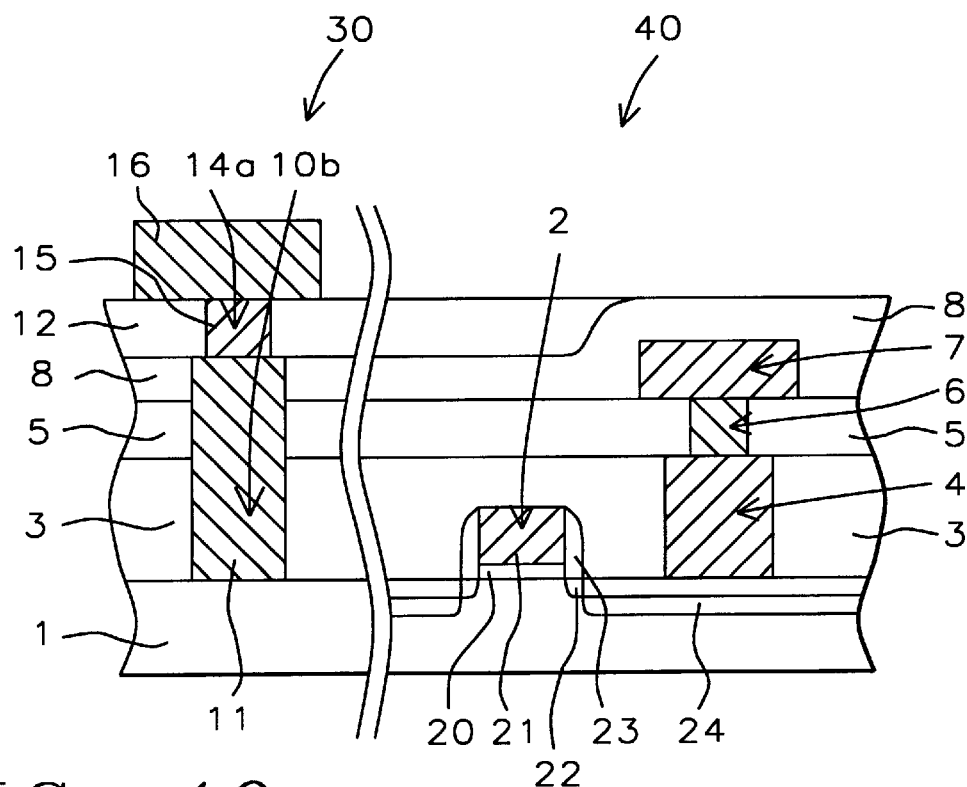

Finally another deposition of aluminum-copper, using plasma vapor deposition procedures, is performed, to a thickness between about 8000 to 9000 Angstroms, with between about 0.50 to 1.0 weight % of copper. Photolithographic and anisotropic RIE procedures, using $Cl_2$ as an etchant, are used to create metal interconnect structure 16, contacting underlying aluminum-copper plug 15. This is schematically shown in FIG. 10. Removal of the photoresist shape, used to form metal interconnect structure 16, is once again accomplished using plasma oxygen ashing and careful wet cleans.

While this invention has been particularly shown and described with reference to the preferred embodiments thereof, it will be understood by those skilled in the art that various changes in form and details may be made without departing from the spirit and the scope of this invention.

What is claimed is:

1. A method for forming a stacked contact hole, in a group of insulator layers, to expose a region of a semiconductor substrate, comprising the steps of:

providing a composite insulator layer on said semiconductor substrate;

depositing a BPSG layer on said composite insulator layer;

reflowing said BPSG layer;

applying a first photoresist shape, comprised with a first diameter opening; on said BPSG layer creating a lower contact hole opening, in said BPSG layer, and in said composite insulator layer, exposing said region, of said semiconductor substrate, with said lower contact hole opening having said first diameter opening;

wet etching of said lower contact hole opening, forming an enlarged lower contact hole opening, and enlarging said first diameter opening to form a second diameter opening;

forming a first metal plug in said enlarged lower contact hole opening;

depositing a silicon oxide insulator layer, on said metal plug, in said enlarged lower contact hole opening, and on top surface of said BPSG layer;

applying a second photoresist shape, comprised with said first diameter opening, with said first diameter opening, of said second photoresist shape, directly overlying said metal plug, in said enlarged lower contact hole;

forming an upper contact hole opening, in said silicon oxide insulator layer, exposing said metal plug, in said enlarged lower contact hole opening, resulting in said stacked contact hole, comprised of said upper contact hole opening, featuring said first diameter opening, overlying said enlarged lower contact hole, featuring said second diameter opening;

forming a second metal plug in said upper contact hole opening, overlying, and contacting, said first metal plug, in said enlarged lower contact hole opening; and forming a metal interconnect structure, overlying and contacting, said second metal plug.

2. The method of claim 1, wherein said composite insulator layer is comprised of a lower insulator layer of borophosphosilicate glass, (BPSG), deposited using LPCVD or PECVD procedures, to a thickness between about 8000 to 9000 Angstroms, and comprised of a upper insulator layer of BPSG, deposited using LPCVD or PECVD procedures, to a thickness between about 4000 to 5000 Angstroms.

3. The method of claim 1, wherein said BPSG layer is deposited using PECVD procedures, to a thickness between about 4000 to 5000 Angstroms, and containing between about 4.0 to 5.0 weight % of $B_2O_3$, and between about 3.0 to 4.0 weight % $P_2O_5$.

4. The method of claim 1, wherein reflowing of said BPSG layer is performed at a temperature between about 850 to 900° C., for a time between about 25 to 35 min., in a nitrogen ambient.

5. The method of claim 1, wherein said lower contact hole opening is created in said BPSG layer, and in said composite insulator layer, via an anisotropic RIE procedure, using $CHF_3$ as an etchant.

6. The method of claim 1, wherein said first diameter opening, of said lower contact hole opening, is between about 0.30 to 0.35 uM.

7. The method of claim 1, wherein said wet etching, performed to said lower contact hole opening, is accomplished in a DHF solution, forming said enlarged lower contact hole opening, with said enlarged lower contact hole opening now comprised with said second diameter opening, between about 0.40 to 0.45 uM.

8. The method of claim 1, wherein said silicon oxide insulator layer, is deposited using PECVD procedures, to a thickness between about 6000 to 8000 Angstroms.

9. The method of claim 1, wherein said upper contact hole opening is created in said silicon oxide insulator layer, via an anisotropic RIE procedure, using $CHF_3$ as an etchant.

10. The method of claim 1, wherein of said first diameter opening, of said upper contact hole opening, is between about 0.30 to 0.35 uM.

11. A method for fabricating a high aspect ratio, stacked contact hole opening, in a group of insulator layers, exposing a region of the semiconductor substrate, in a peripheral region of the semiconductor chip, with the group of insulator layers being used to passivate structures used in a cell array region, of the semiconductor chip, comprising the steps of:

providing a transfer gate transistor, in said cell array region, of said semiconductor chip;

depositing a first insulator layer on said transfer gate transistor;

planarizing said first insulator layer;

forming a first polysilicon plug, in said first insulator layer, contacting a region of said semiconductor substrate, in said cell array region;

depositing a second insulator layer on said first polysilicon plug and said first insulator layer;

forming a second polysilicon plug, in said second insulator layer, overlying and contacting said first polysilicon plug, in said cell array region;

forming a capacitor structure on said second insulator layer, overlying and contacting, said second polysilicon plug, in said cell array region;

depositing a BPSG layer; on said capacitor structure reflowing said BPSG layer;

forming a lower contact hole opening, in said BPSG layer, in said second insulator layer, and in said first insulator layer, exposing a region of said semiconductor substrate, in said peripheral region, with said lower contact hole opening having a first diameter opening;

wet etching to enlarge said first diameter opening, of said lower contact hole opening, forming an enlarged lower contact hole opening, with a second diameter opening;

forming a tungsten plug, in said enlarged lower contact opening, contacting said region of said semiconductor substrate, in said peripheral region;

depositing a silicon oxide layer on said tungsten plug and said BPSG layer;

forming an upper contact hole opening, in said silicon oxide layer, exposing underlying, said tungsten plug, in said enlarged lower contact hole opening, and with said upper contact hole opening having said first diameter opening;

performing a metal pre-clean procedure;

forming an aluminum-copper plug, in said upper contact hole opening , overlying and contacting, said tungsten plug, and resulting in said high aspect ratio, stacked contact hole opening, in said peripheral region, comprised of said upper contact hole opening, filled with said aluminum-copper plug, and said enlarged lower contact hole opening, filled with said tungsten plug; and forming a metal interconnect structure, in said peripheral region, overlying and contacting, said aluminum-copper plug.

12. The method of claim 11, wherein said first insulator layer is boro-phosphosilicate glass, (BPSG), deposited using LPCVD or PECVD procedures, to a thickness between about 8000 to 9000 Angstroms.

13. The method of claim 11, wherein said second insulator layer is BPSG, deposited using LPCVD or PECVD procedures, to a thickness between about 4000 to 5000 Angstroms.

14. The method of claim 11, wherein said BPSG layer is deposited using PECVD procedures, to a thickness between about 4000 to 5000 Angstroms, with a $B_2O_3$ weight % between about 4.0 to 5.0, and with a $P_2O_5$ weight %, between about 3.0 to 4.0.

15. The method of claim 11, wherein said BPSG layer is reflowed at a temperature between about 850 to 900° C., for a time between about 25 to 35 min., in a nitrogen ambient.

16. The method of claim 11, wherein said lower contact hole opening is formed in said BPSG layer, in said second insulator layer, and in said first insulator layer, via an anisotropic RIE procedure, using $CHF_3$ as an etchant, with said lower contact hole opening having a first diameter opening, between about 0.30 to 0.35 uM.

17. The method of claim 11, wherein said enlarged lower contact opening is formed via a DHF procedure, applied to said lower contact hole opening, resulting in a second diameter opening, for said enlarged lower contact hole is opening, between about 0.40 to 0.45 uM.

18. The method of claim 11, wherein said silicon oxide layer is deposited using PECVD procedures, to a thickness between about 6000 to 8000 Angstroms.

19. The method of claim 11, wherein said upper contact hole opening is formed in said silicon oxide layer, via an anisotropic RIE procedure, using $CHF_3$ as an etchant, resulting in said upper contact hole opening, with said first diameter opening, between about 0.30 to 0.35 uM.

* * * * *